US006100202A

United States Patent [19]

Lin et al.

[11] Patent Number: 6,100,202

[45] Date of Patent: *Aug. 8, 2000

[54] PRE DEPOSITION STABILIZATION METHOD FOR FORMING A VOID FREE ISOTROPICALLY ETCHED ANISOTROPICALLY PATTERNED DOPED SILICATE GLASS LAYER

[75] Inventors: Been-Hon Lin, Koashuing; Bing-Huei Peng, Hsin-Chu; Chung-Chieh Liu, Hsinchu, all of Taiwan

[73] Assignee: Taiwan Semiconductor Manufacturing Company, Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/986,530

[22] Filed: Dec. 8, 1997

[51] Int. Cl.[7] .................... H01L 21/4763; H01L 21/302; H01L 21/461; H01L 21/31; H01L 21/469

[52] U.S. Cl. .......................... 438/734; 438/622; 438/637; 438/704; 438/705; 438/723; 438/735; 438/745; 438/749; 438/756; 438/778; 438/783; 438/784

[58] Field of Search .................................... 483/784, 702, 483/637, 762, 704, 734, 735, 745, 749; 438/704, 705, 706, 723, 734, 735, 743, 745, 749, 750, 751, 756, 778, 783, 784, 787, 637, 622

[56] References Cited

U.S. PATENT DOCUMENTS 4,892,753 1/1990 Wang et al. .............................. 427/38
5,104,482 4/1992 Monkowski et al. ................... 145/643
5,643,828 7/1997 Dean et al. ............................. 437/238
5,650,041 7/1997 Gotoh et al. ......................... 156/653.1
5,766,992 6/1998 Chou et al. ............................ 438/241
5,770,469 6/1998 Uram et al. ............................ 437/240
5,880,019 3/1999 Hsieh et al. ........................... 438/666
5,935,340 8/1999 Xia et al. ................................. 134/11
5,942,446 8/1999 Chen et al. ............................ 438/734

OTHER PUBLICATIONS

S. Wolf and R. N. Tauber, Silicon Processing for the VLSI Era, vol. 1, Process Technology, 1986.

*Primary Examiner*—Charles Bowers
*Assistant Examiner*—Tanhha Pham
*Attorney, Agent, or Firm*—George O. Saile; Stephen B. Akerman; Alek P. Szecsy

[57] ABSTRACT

A chemical vapor deposition (CVD) method for forming a doped silicate glass dielectric layer within a microelectronics fabrication. There is first positioned within a reactor chamber a substrate employed within a microelectronics fabrication. There is then stabilized within the reactor chamber with respect to the substrate a first flow of a silicon source material absent a flow of a dopant source material. There is then deposited upon the substrate within the reactor chamber a doped silicate glass dielectric layer through a chemical vapor deposition (CVD) method. The doped silicate glass dielectric layer is formed employing a second flow of the silicon source material, a flow of an oxidant source material and the flow of the dopant source material. There may subsequently be formed through the doped silicate glass dielectric layer an anisotropically patterned via through an anisotropic patterning method. The anisotropically patterned via may then be isotropically etched to form an isotropically etched anisotropically patterned via without void formation within the sidewalls of the isotropically etched anisotropically patterned via.

12 Claims, 5 Drawing Sheets

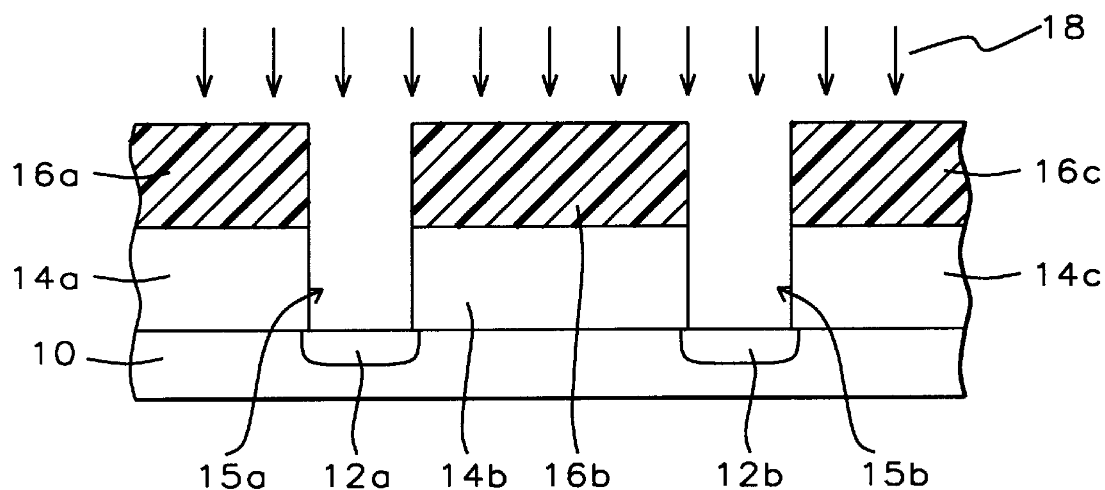
FIG. 1 - Prior Art
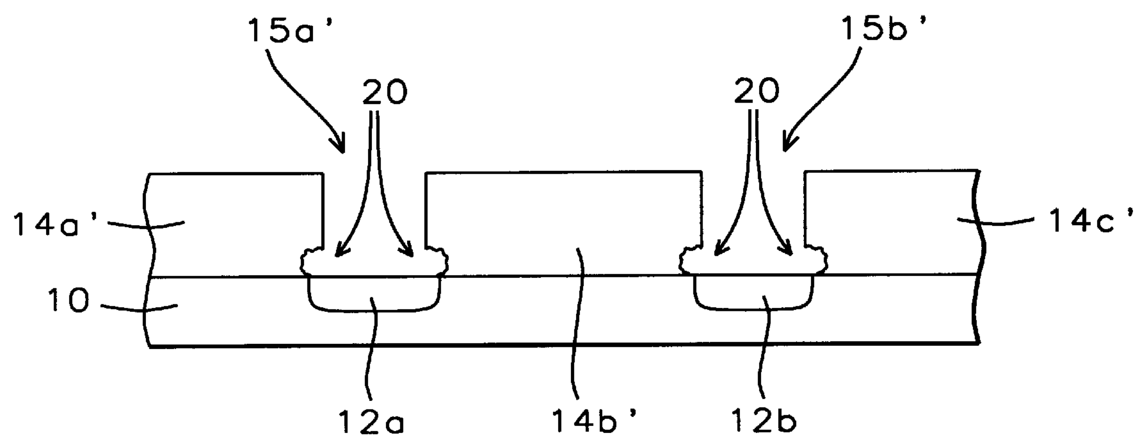
FIG. 2 - Prior Art
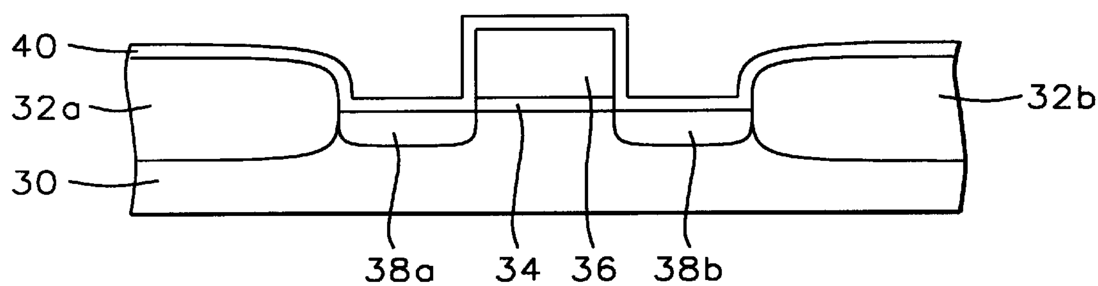
FIG. 3

PRE DEPOSITION STABILIZATION METHOD FOR FORMING A VOID FREE ISOTROPICALLY ETCHED ANISOTROPICALLY PATTERNED DOPED SILICATE GLASS LAYER

BACKGROUND OF THE INVENTION

1. Field of the Invention

The present invention relates generally to dielectric layers within microelectronics fabrications. More particularly, the present invention relates to doped silicate glass dielectric layers within microelectronics fabrications.

2. Description of the Related Art

Microelectronics fabrications are formed employing microelectronics substrates upon which are formed patterned conductor layers which are separated by dielectric layers. Within microelectronics fabrications in general, a particularly common dielectric material which is employed in forming dielectric layers within microelectronics fabrications is a boron and/or phosphorus doped silicate glass dielectric material, such as a boro silicate glass (BSG) dielectric material, a phospho silicate glass (PSG) dielectric material or a boro phospho silicate glass (BPSG) dielectric material.

Boron and/or phosphorus doped silicate glass dielectric materials are desirable when employed in forming dielectric layers within microelectronics fabrications since such boron and/or phosphorus doped silicate glass dielectric materials are readily reflowed at comparatively low temperatures to form reflowed boron and/or phosphorus doped silicate glass dielectric layers which can typically substantially planarize irregular substrate surfaces within microelectronics fabrications within which they are formed. Typically, although not exclusively, boron and/or phosphorus doped silicate glass dielectric layers are formed within microelectronics fabrications through a chemical vapor deposition (CVD) method, either thermally activated or plasma activated, employing a silicon source material such as but not limited to tetra ethyl ortho silicate (TEOS) or silane, along with a suitable boron and/or phosphorus dopant source material.

While boron and/or phosphorus doped silicate glass dielectric layers formed through chemical vapor deposition (CVD) methods employing suitable silicon source materials in conjunction with suitable boron and/or phosphorus source materials are thus desirable in the art of microelectronics fabrication, boron and/or phosphorus doped silicate glass dielectric layers formed through chemical vapor deposition (CVD) methods employing suitable silicon source materials in conjunction with suitable boron and/or phosphorus source materials are not entirely without problems within microelectronics fabrication. In particular, it is known in the art of microelectronics fabrication that doped silicate glass layers when formed through chemical vapor deposition (CVD) methods, patterned through conventional anisotropic patterning methods and subsequently isotropically etched with isotropic etchants containing hydrofluoric acid, such as but not limited to dilute hydrofluoric acid etchants and buffered oxide etchants (ie: aqueous hydrofluoric acid and ammonium fluoride mixtures), often exhibit irregular via sidewall profiles characterized by increased isotropic etching and void formation at the base of those irregular via sidewall profiles. A pair of schematic cross-sectional diagrams illustrating the results of forming a pair of such irregular sidewall profile vias defined by a series of such isotropically etched anisotropically patterned doped silicate glass dielectric layers is shown in FIG. 1 and FIG. 2.

Shown in FIG. 1 is a substrate 10 having formed therein a pair of contact regions 12*a* and 12*b*. Access to the pair of contact regions 12*a* and 12*b* is through a pair of anisotropically patterned contact vias 15*a* and 15*b* defined by a series of anisotropically patterned doped silicate glass dielectric layers 14*a*, 14*b* and 14*c*. The anisotropically patterned doped silicate glass dielectric layers 14*a*, 14*b* and 14*c* are in turn formed through etching a corresponding blanket doped silicate glass dielectric layer within an anisotropic etching plasma 18, while employing a series of patterned photoresist layers 16*a*, 16*b* and 16*c* as a series of photoresist etch mask layers.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein: (1) the patterned photoresist layers 16*a*, 16*b* and 16*c* have been stripped from the microelectronics fabrication; and (2) the microelectronics fabrication has subsequently been isotropically etched within an isotropic etchant, typically although not exclusively a hydrofluoric acid containing isotropic etchant. Isotropic etching of the microelectronics fabrication whose schematic cross-sectional diagram is illustrated in FIG. 1 to provide the microelectronics fabrication whose schematic cross-sectional diagram is illustrated in FIG. 2 is commonly employed within microelectronics fabrications prior to forming a pair of contact layers within the pair of anisotropically patterned contact vias 15*a* and 15*b*.

As is illustrated within the schematic cross-sectional diagram of FIG. 2, the resulting isotropically etched anisotropically patterned contact vias 15*a'* and 15*b'* defined by the series of isotropically etched anisotropically patterned doped silicate glass dielectric layers 14*a'*, 14*b'* and 14*c'* have irregularly formed via sidewalls characterized by a series of voids 20 formed at the junctures of the series of isotropically etched anisotropically patterned doped silicate glass dielectric layers 14*a'*, 14*b'* and 14*c'* with the contact regions 12*a* and 12*b* within the substrate 10.

Voids which are formed when isotropically etching anisotropically patterned vias which in turn are formed through doped silicate glass dielectric layers within microelectronics fabrications (such as the voids 20 within the isotropically etched anisotropically patterned vias 15*a'* and 15*b'* defined by the isotropically etched anisotropically patterned doped silicate glass dielectric layers 14*a'*, 14*b'* and 14*c'* within the microelectronics fabrication whose schematic cross-sectional diagram is illustrated in FIG. 2) are undesirable within microelectronics fabrication. In particular, when such vias are separated by particularly narrow widths of isotropically etched anisotropically patterned doped silicate glass dielectric material the voids formed therein may cause contact layer bridging between contact layers subsequently formed within adjacent vias. It is thus towards the goal of forming within microelectronics fabrications void free vias incident to isotropically etching anisotropically patterned vias which are formed through doped silicate glass dielectric layers within microelectronic fabrications that the present invention is generally directed.

Various methods have been disclosed in the art of microelectronics fabrication for forming dielectric layers with novel and desirable properties within microelectronics fabrications.

For example, Wang et al., in U.S. Pat. No. 4,892,753, discloses a plasma enhanced chemical vapor deposition (PECVD) method for forming a silicon oxide dielectric layer within an integrated circuit microelectronics fabrication while employing tetra ethyl ortho silicate (TEOS) as a silicon source material. The method employs a comparatively high deposition pressure of from about 1 to about 50 torr to form the plasma enhanced chemical vapor deposited (PECVD) silicon oxide layer with improved step coverage upon a topographic substrate layer, and with lower stress.

In addition, Monkowski et al., in U.S. Pat. No. 5,104,482, discloses a method for forming a boro phospho silicate glass (BPSG) dielectric layer upon a topographic substrate layer within an integrated circuit microelectronics fabrication. The method employs a sufficiently high reactant velocity and a sufficiently high reactant deposition temperature to provide simultaneous deposition and viscoelastic flow properties of the boro phospho silicate glass (BPSG) dielectric layer, thus providing substantially void free topographic planarization of the topographic substrate layer with the boro phospho silicate glass (BPSG) dielectric layer.

Finally, Dean et al., in U.S. Pat. No. 5,643,838, also discloses a plasma enhanced chemical vapor deposition (PECVD) method for forming a silicon oxide dielectric layer upon a topographic substrate layer within a microelectronics fabrication while employing tetra ethyl ortho silicate (TEOS) as a silicon source material. Through the method the silicon oxide dielectric layer is formed void free upon the topographic substrate layer with sufficiently attenuated moisture and silanol presence within the silicon oxide dielectric layer such that there is avoided integrated circuit device degradation within an integrated circuit within which is formed the silicon oxide dielectric layer.

Desirable within the art of microelectronics fabrication are methods and materials through which isotropically etched anisotropically patterned vias defined by isotropically etched anisotropically patterned doped silicate glass dielectric layers within microelectronics fabrications may be formed without voids within the sidewalls of those isotropically etched anisotropically patterned vias. More particularly desirable within the art of integrated circuit microelectronics fabrication are methods and materials through which isotropically etched anisotropically patterned vias defined by isotropically etched anisotropically patterned doped silicate glass dielectric layers within integrated circuit microelectronics fabrications may be formed without voids within the sidewalls of those isotropically etched anisotropically patterned vias. It is towards the foregoing goals that the present invention is both generally and more specifically directed.

SUMMARY OF THE INVENTION

A first object of the present invention is to provide a method for forming within a microelectronics fabrication an isotropically etched anisotropically patterned via defined by a pair of isotropically etched anisotropically patterned doped silicate glass dielectric layers.

A second object of the present invention is to provide a method in accord with the first object of the present invention, where the isotropically etched anisotropically patterned via is formed without forming a void within a sidewall of the isotropically etched anisotropically patterned via.

A third object of the present invention is to provide a method in accord with the first object of the present invention or the second object of the present invention, where the microelectronics fabrication is an integrated circuit microelectronics fabrication and the via is a contact via within the integrated circuit microelectronics fabrication.

A fourth object of the present invention is to provide a method in accord with the first object of the present invention, the second object of the present invention or the third object of the present invention, which method is readily manufacturable.

In accord with the objects of the present invention, there is provided a chemical vapor deposition (CVD) method for forming a doped silicate glass dielectric layer within a microelectronics fabrication. To practice the method of the present invention, there is first positioned within a reactor chamber a substrate employed within a microelectronics fabrication. There is then stabilized within the reactor chamber with respect to the substrate a first flow of a silicon source material absent a flow of a dopant source material. There is then deposited upon the substrate within the reactor chamber a doped silicate glass dielectric layer. The doped silicate glass dielectric layer is formed employing a second flow of the silicon source material, a flow of an oxidant source material and the flow of the dopant source material. There may then be etched through an anisotropic etch method the doped silicate glass dielectric layer to form an anisotropically patterned via through the doped silicate glass dielectric layer. The anisotropically patterned via may then be isotropically etched to form an isotropically etched anisotropically patterned via through the doped silicate glass dielectric layer, where the isotropically etched anisotropically patterned via is formed without forming voids within the sidewalls of the isotropically etched anisotropically patterned via.

The present invention provides a method for forming within a microelectronics fabrication an isotropically etched anisotropically patterned via defined by a pair of isotropically etched anisotropically patterned doped silicate glass dielectric layers, where the isotropically etched anisotropically patterned via is formed without forming a void within a sidewall of the isotropically etched anisotropically patterned via. The method of the present invention realizes the foregoing objects by employing when forming upon a substrate employed within a microelectronics fabrication a doped silicate glass dielectric layer through which is subsequently formed the isotropically etched anisotropically patterned via a stabilization process step with respect to the substrate within a reactor chamber within which is formed the doped silicate glass dielectric layer. The stabilization process step employs a first flow of a silicon source material absent a flow of a dopant source material. Subsequent to the stabilization process step there is then formed the doped silicate glass dielectric layer employing a second flow of the silicon source material, a flow of an oxidant source material and the flow of the dopant source material. A via may then be anisotropically patterned through the doped silicate glass dielectric layer and subsequently isotropically etched without forming voids within the sidewalls of the isotropically etched anisotropically patterned doped via so formed.

The method of the present invention may be employed where the microelectronics fabrication is an integrated circuit microelectronics fabrication and where the isotropically etched anisotropically patterned via is a contact via formed through the doped silicate glass dielectric layer within the integrated circuit microelectronics fabrication. The method of the present invention does not discriminate with respect to: (1) the nature of the microelectronics fabrication within which is formed through a doped silicate glass dielectric layer an isotropically etched anisotropically patterned via; or (2) the nature of the isotropically etched anisotropically patterned via formed through the doped silicate glass dielectric layer through the method of the present invention. Thus, although the method of the present invention provides substantial value when forming an isotropically etched anisotropically patterned contact via through a doped silicate glass pre-metal dielectric (PMD) layer within an integrated circuit microelectronics fabrication, the method of the present invention may also be employed in forming isotropically etched anisotropically patterned vias including but not limited to contact vias and interconnection vias through doped silicate glass dielectric layers within microelectronics fabrications including but not limited to integrated circuit microelectronics fabrications, solar cell microelectronics fabrications, ceramic substrate microelectronics fabrications and flat panel display microelectronics fabrications.

The method of the present invention is readily manufacturable. The method of the present invention employs a pre-deposition stabilization step when forming within a microelectronics fabrication through the method of the present invention a doped silicate glass dielectric layer. The doped silicate glass dielectric layer so formed is formed employing methods and materials which are otherwise generally known in the art of microelectronics fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating void formation within the sidewalls of a pair of isotropically etched anisotropically patterned vias defined by a pair of isotropically etched anisotropically patterned doped silicate glass dielectric layers within a microelectronics fabrication in absence of the present invention.

FIG. 3 to FIG. 11 show a series of schematic cross-sectional diagrams illustrating the results of forming within an integrated circuit microelectronics fabrication a series of doped silicate glass dielectric layers having formed therethrough a series of isotropically etched anisotropically patterned vias without forming voids within the sidewalls of the isotropically etched anisotropically patterned vias, through the method of the present invention.

DESCRIPTION OF THE PREFERRED EMBODIMENT

Figure 4:
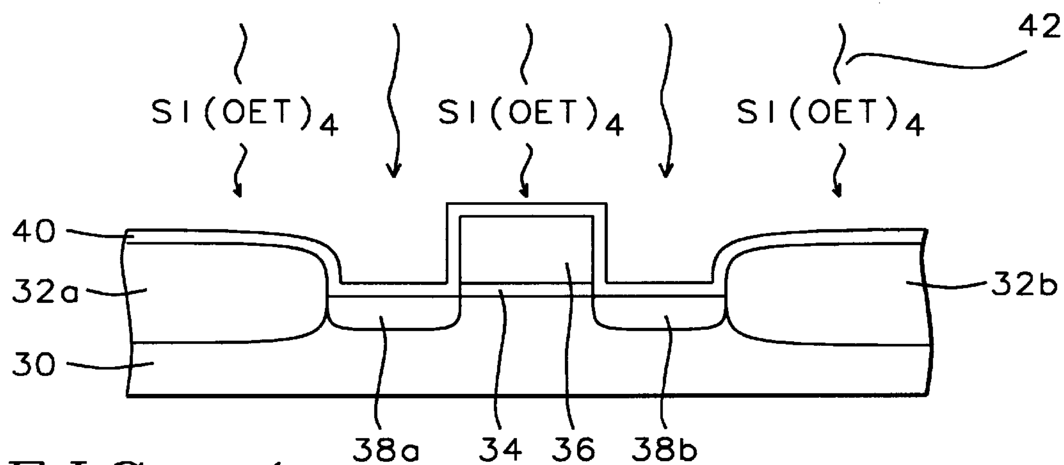

The present invention provides a method for forming within a microelectronics fabrication a doped silicate glass dielectric layer having formed therethrough an isotropically etched anisotropically patterned via, where the isotropically etched anisotropically patterned via is formed without voids within the sidewalls of the isotropically etched anisotropically patterned via. The present invention realizes the foregoing object by employing when forming the doped silicate glass dielectric layer over a substrate within the microelectronics fabrication a pre-deposition stabilization process step where the substrate is stabilized with respect to a first flow of a silicon source material absent a dopant source material. Subsequent to the pre-deposition stabilization process step, the doped silicate glass dielectric layer is formed employing a second flow of the silicon source material, a flow of an oxidant source material and the flow of the dopant source material.

Although the method of the present invention provides substantial value when forming an isotropically etched anisotropically patterned contact via through a doped silicate glass pre-metal dielectric (PMD) layer within an integrated circuit microelectronics fabrication, the method of the present invention may also be employed in forming isotropically etched anisotropically patterned vias including but not limited to contact vias and interconnection vias through doped silicate glass dielectric layers within microelectronics fabrications including but not limited to integrated circuit microelectronics fabrications, solar cell microelectronics fabrications, ceramic substrate microelectronics fabrications and flat panel display microelectronics fabrications.

Referring now to FIG. 3 to FIG. 11, there is shown a series of schematic cross-sectional diagrams illustrating the results of forming within an integrated circuit microelectronics fabrication through the preferred embodiment of the method of the present invention a series of doped silicate glass dielectric layers having formed therethrough a series of isotropically etched anisotropically patterned vias without forming voids within the sidewalls of the isotropically etched anisotropically patterned vias. Shown in FIG. 3 is a schematic cross-sectional diagram of the integrated circuit microelectronics fabrication at an early stage in its fabrication.

Shown in FIG. 3 is a semiconductor substrate 30 having formed within and upon its surface a pair of isolation regions 32*a* and 32*b* which define an active region of the semiconductor substrate 30. Although semiconductor substrates are known in the art with either dopant polarity, various dopant concentrations and several crystallographic orientations, for the preferred embodiment of the present invention, the semiconductor substrate 30 is preferably a (100) silicon semiconductor substrate having an N- or P-doping. Similarly, although it is also known in the art of integrated circuit microelectronics fabrication that isolation regions may be formed within and/or upon semiconductor substrates to define active regions of those semiconductor substrates through methods including but not limited to isolation region thermal growth methods and isolation region deposition/patterning methods, for the preferred embodiment of the present invention, the isolation regions 32*a* and 32*b* are preferably formed within and upon the semiconductor substrate 30 to define the active region of the semiconductor substrate 30 through an isolation region thermal growth method which forms the isolation regions 32*a* and 32*b* of silicon oxide within and upon the semiconductor substrate 30.

Shown also within FIG. 3 formed within or upon the active region of the semiconductor substrate 30 is a series of structures which comprises a field effect transistor (FET). The series of structures includes: (1) a gate dielectric layer 34 formed upon the active region of the semiconductor substrate 30; (2) a gate electrode 36 formed and aligned upon the gate dielectric layer 34; and (3) a pair of source/drain regions 38*a* and 38*b* formed within the semiconductor substrate at a pair of opposite edges of the gate dielectric layer 34 and the gate electrode 36. Each of the structures within the series of structures which comprises the field effect transistor (FET) may be formed through methods and materials as are conventional in the art of forming field effect transistors (FETs) within integrated circuit microelectronics fabrications.

For example, it is known in the art of integrated circuit microelectronics fabrication that gate dielectric layers may be formed through patterning, while employing methods as are conventional in the art, of blanket gate dielectric layers formed employing blanket gate dielectric layer thermal growth methods and blanket gate dielectric layer deposition methods, as are known in the art of integrated circuit microelectronic fabrication. However, for the preferred embodiment of the present invention, the gate dielectric layer 34 is preferably formed through patterning, while employing methods as are conventional in the art, of a blanket gate dielectric layer of silicon oxide of thickness about 70 to about 150 angstroms, where the blanket gate dielectric layer is formed incident to a thermal oxidation of the active region of the semiconductor substrate 30.

In addition, although it is also known in the art of integrated circuit microelectronics fabrication that gate electrodes may be formed through patterning, through methods as are conventional in the art, of blanket layers of gate electrode materials such as but not limited to metals, metal alloys, doped polysilicon and polycides (ie: doped polysilicon/metal silicide stacks) formed upon blanket gate dielectric layers, for the preferred embodiment of the present invention the gate electrode 36 is preferably formed through patterning, through methods as are conventional in the art, of a blanket layer of doped polysilicon or polycide gate electrode material formed to a thickness of from about 1500 to about 3000 angstroms upon the blanket gate dielectric layer.

Finally, as is common in the art of integrated circuit microelectronics fabrication, the source/drain electrode regions 38*a* and 38*b* are preferably formed within the active region of the semiconductor substrate while employing at least the gate electrode as a mask at an ion implantation dose of from about 5E15 to about 7E15 dopant ions per square centimeter and an ion implantation energy of from about 100 to about 150 keV.

Additionally, there is also shown within FIG. 3 formed over the semiconductor substrate 30 including the series of structures which forms the field effect transistor (FET) a blanket conformal pre-metal dielectric (PMD) layer 40. Within the preferred embodiment of the present invention, the blanket conformal pre-metal dielectric (PMD) layer 40 serves as a dopant diffusion barrier between the semiconductor substrate 30 and a blanket doped silicate glass dielectric layer subsequently formed over the semiconductor substrate 30. Thus, although methods and materials through which may be formed comformal pre-metal dielectric (PMD) layers are generally known in the art of integrated circuit microelectronics fabrications to include chemical vapor deposition (CVD) methods, plasma enhanced chemical vapor deposition (PECVD) methods and physical vapor deposition (PVD) sputtering methods through which may be formed conformal pre-metal dielectric (PMD) layers of dielectric materials including but not limited to silicon oxide dielectric materials, silicon nitride dielectric materials and silicon oxynitride dielectric materials, for the preferred embodiment of the present invention, the blanket conformal pre-metal dielectric (PMD) layer 40 is preferably formed of a higher density undoped silicon oxide dielectric material deposited through a plasma enhanced chemical vapor deposition (PECVD)) method, as is commonly employed within the art of integrated circuit microelectronics fabrication to provide pre-metal dielectric (PMD) layers of optimal density and barrier properties. Preferably the blanket conformal pre-metal dielectric (PMD) layer 40 so formed is formed to a thickness of from about 500 to about 1000 angstroms.

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein the semiconductor substrate 30 having the field effect transistor (FET) structure formed therein and thereupon and the blanket conformal pre-metal dielectric (PMD) 40 layer formed thereover is stabilized within a first flow of a silicon source material. Within the preferred embodiment of the present invention, the first flow of the silicon source material is a first tetra ethyl ortho silicate (TEOS) silicon source material stabilizing flow 42. Although not specifically illustrated within the schematic cross-sectional diagram of FIG. 4, the semiconductor substrate 30 and the first tetra ethyl ortho silicate (TEOS) silicon source material stabilizing flow 42 are contained within an appropriate chemical vapor deposition (CVD) reactor chamber.

The method of the present invention may be employed when a method for forming a doped silicate glass dielectric layer upon the blanket conformal pre-metal dielectric (PMD) layer 40 as illustrated in FIG. 4 is chosen from any of several chemical vapor deposition (CVD) methods as are known in the art of integrated circuit microelectronics fabrication. Such chemical vapor deposition (CVD) methods may include, but are not limited to, low pressure thermal chemical vapor deposition (LPCVD) methods, plasma enhanced chemical vapor deposition (PECVD) methods which are inherently undertaken at low pressures, sub-atmospheric pressure thermal chemical vapor deposition (SACVD) methods which are inherently undertaken at higher pressures without plasma activation and atmospheric pressure thermal chemical vapor (APCVD) methods which are also inherently undertaken without plasma activation. Low pressures within low pressure thermal chemical vapor deposition (CVD) methods and plasma enhanced chemical vapor deposition (PECVD) methods are generally less than about 10 torr. Higher pressures within sub-atmospheric pressure thermal chemical vapor deposition (SACVD) methods are typically about 200 to about 450 torr.

It is believed that the method of the present invention provides void free isotropically etched anisotropically patterned vias defined by isotropically etched anisotropically patterned doped silicate glass dielectric layers by precluding initial formation of a dopant rich doped silicate glass dielectric region within a doped silicate glass dielectric layer, which dopant rich doped silicate glass dielectric region is otherwise susceptible to etching within an isotropic etchant which is employed in isotropically etching an anisotropically patterned via through the doped silicate glass dielectric layer. The method of the present invention precludes initial formation of such a dopant rich doped silicate glass dielectric region by stabilizing a substrate within a silicon source material absent a dopant source material prior to forming over the substrate the doped silicate glass dielectric layer. Thus, the method of the present invention provides optimal value when dopant volatility within a chemical vapor deposition (CVD) method for forming a doped silicate glass dielectric layer over a substrate employed within a microelectronics fabrication is high in comparison with silicon source material volatility.

Within the preferred embodiment of the present invention, the first tetra ethyl ortho silicate (TEOS) silicon source material stabilizing flow 42 as illustrated within FIG. 4 is preferably provided at: (1) a reactor chamber pressure of from about 180 to about 220 torr; (2) a semiconductor substrate 30 temperature of from about 380 to about 420 degrees centigrade; (3) a tetra ethyl ortho silicate (TEOS)

flow rate of from about 400 to about 600 standard cubic centimeters per minute (sccm); and (4) a helium:oxygen 60:30 vol:vol background flow rate of from about 8000 to about 10000 aggregate standard cubic centimeters per minute (sccm). Preferably, the semiconductor substrate 30 is stabilized within the first tetra ethyl ortho silicate (TEOS) silicon source material stabilizing flow 42 for a time period of from about 1 to about 3 seconds prior to forming thereover a doped silicate glass dielectric layer.

Figure 5:
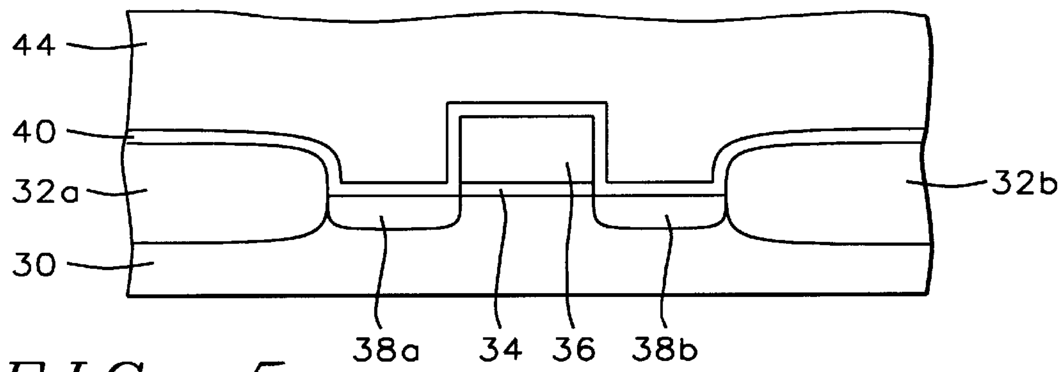

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein there is formed upon the blanket conformal pre-metal dielectric (PMD) layer 40 a blanket gap filling doped silicate glass pre-metal dielectric (PMD) layer 44. In accord with the above noted options, the blanket gap filling doped silicate glass pre-metal dielectric (PMD) layer 44 is preferably formed through an ozone assisted sub-atmospheric pressure thermal chemical vapor deposition (SACVD) method or an ozone assisted atmospheric pressure thermal chemical vapor deposition (APCVD) method. Either of the foregoing two methods employs: (1) a second flow of the silicon source material which is a tetra ethyl ortho silicate (TEOS) silicon source material, along with; (2) a flow of an oxidant source material which is an ozone oxidant source material; and (3) the flow of the dopant source material which preferably includes both a boron dopant source material and a phosphorus dopant source material. More preferably, the boron dopant source material is triethyl borane (B(C2H5)3) and the phosphorus dopant source material is triethyl phosphite (P(OC2H5)3), although alternative boron dopant source materials an d phosphorus dopant source materials as noted below may also be employed.

When employing within the method of the present invention for forming the blanket gap filling doped silicate glass pre-metal dielectric (PMD) layer 44 chemical vapor deposition methods other than ozone assisted sub-atmospheric pressure thermal chemical vapor deposition (SACVD) methods and ozone assisted atmospheric pressure thermal chemical vapor deposition (APCVD) methods, alternative silicon source materials, oxidant source materials and dopant source materials may be employed. Alternative silicon source materials include but are not limited to tetra ethyl ortho silicate (TEOS) and silane. Alternative oxidant source materials include but are not limited to oxygen, ozone, nitrous oxide and nitric oxide. Alternative dopant source materials include but are not limited to borane (BH3), diborane (B2H6), trimethyl borane (B(CH3)3), triethyl borane (B(C2H5)3), trimethyl borate (B(OCH3)3), triethylborate (B(OC2H5)3), phosphine (PH3), trimethyl phosphite (P(OCH3)3), triethyl phosphite (P(OC2H5)3), trimethyl phosphate (P(O)(OCH3)3) and/or triethyl phosphate (P(O)(OC2H5)3).

Within the preferred embodiment of the present invention, the ozone assisted sub-atmospheric pressure thermal chemical vapor deposition (SACVD) method or the ozone assisted atmospheric pressure thermal chemical vapor deposition (APCVD) method also employs: (1) a reactor chamber pressure of from about 180 to about 220 torr; (2) a semiconductor substrate 30 temperature of from about 380 to about 420 degrees centigrade; (3) the tetra ethyl ortho silicate (TEOS) silicon source material second flow rate of from about 400 to about 600 standard cubic centimeters per minute (sccm) in a helium carrier gas flow rate of about 4000 to about 6000 standard cubic centimeters per minute (sccm); (4) the ozone oxidant source material flow rate of from about 3000 to about 6000 standard cubic centimeters per minute (sccm) within an oxygen carrier gas flow rate of from about 3000 to about 4000 standard cubic centimeters per minute (sccm); (5) the triethyl borane boron dopant source material flow rate of from about 180 to about 200 standard cubic centimeters per minute (sccm); and (6) the triethyl phosphite phosphorus dopant source material flow rate of from about 30 to about 40 standard cubic centimeters per minute (sccm). Preferably, the blanket gap filling doped silicate glass pre-metal dielectric (PMD) layer 44 is formed to a thickness of from about 10000 to about 11000 angstroms upon the blanket conformal pre-metal dielectric (PMD) layer 40.

Figure 6:
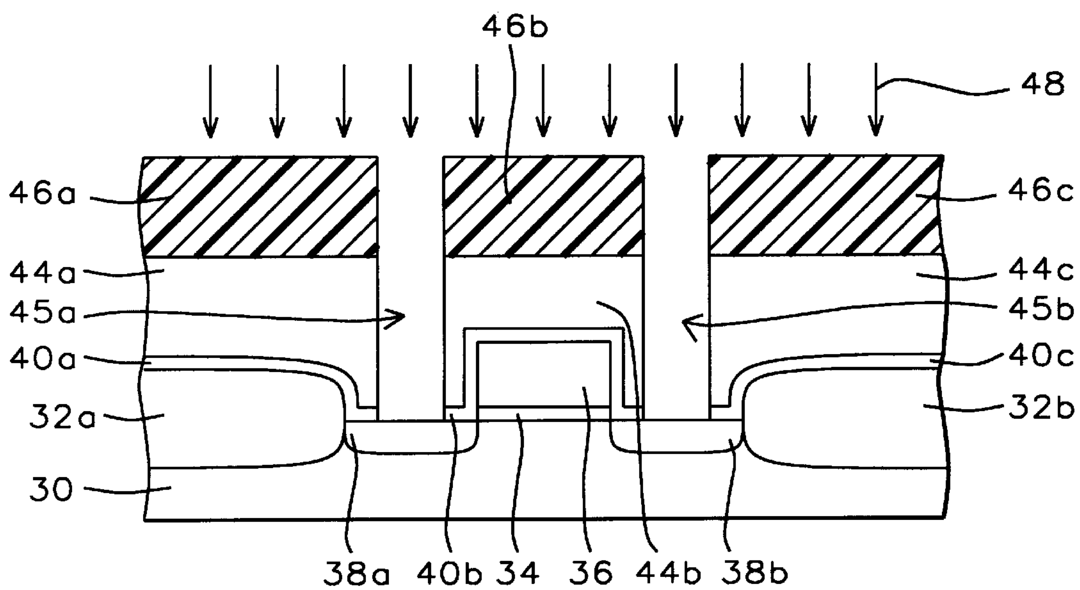

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein: (1) the blanket gap filling doped silicate glass pre-metal dielectric (PMD) layer 44 has been planarized; (2) the blanket planarized gap filling doped silicate glass pre-metal dielectric (PMD) layer so formed has formed thereupon a series of patterned first photoresist layers 46*a*, 46*b* and 46*c*; and (3) the blanket planarized gap filling doped silicate glass pre-metal dielectric (PMD) layer and the blanket conformal pre-metal dielectric (PMD) layer 40 are then anisotropically patterned within a first anisotropic etching plasma 48 while employing the series of patterned first photoresist layers 46*a*, 46*b* and 46*c* as a first etch mask to form the anisotropically patterned conformal pre-metal dielectric (PMD) layers 40*a*, 40*b* and 40*c* and the anisotropically patterned planarized gap filling doped silicate glass pre-metal dielectric (PMD) layers 44*a*, 44*b* and 44*c* which simultaneously define a pair of anisotropically patterned contact vias 45*a* and 45*b*. The integrated circuit microelectronics fabrication whose schematic cross-sectional diagram is illustrated in FIG. 6 may be formed from the integrated circuit microelectronics fabrication whose schematic cross-sectional diagram is illustrated in FIG. 5 through methods and materials as are conventional in the art of integrated circuit microelectronics fabrication.

For example, the blanket gap filling doped silicate glass pre-metal dielectric (PMD) layer 44 may be planarized to form the blanket planarized gap filling doped silicate glass pre-metal dielectric (PMD) layer through reactive ion etch (RIE) etchback planarizing methods and chemical mechanical polish (CMP) planarizing methods, optionally employing sacrificial spin-on-glass (SOG) planarizing dielectric layers, as are known in the art of integrated circuit microelectronics fabrication.

Similarly, the series of patterned first photoresist layers 46*a*, 46*b* and 46*c* may be formed within the integrated circuit microelectronics fabrication whose schematic cross-sectional diagram is illustrated in FIG. 6 from any of several photoresist materials as are conventionally known in the art of integrated circuit microelectronics fabrication, including but not limited to positive photoresist materials and negative photoresist materials. Preferably, the patterned first photoresist layers 46*a*, 46*b* and 46*c* are each formed to a thickness of from about 4000 to about 7000 angstroms upon the blanket planarized gap filling doped silicate glass pre-metal dielectric (PMD) layer.

Finally, the first anisotropic etching plasma 48 will typically employ a fluorine containing etchant gas composition employing fluorine containing etchant gases such as, but not limited to, perflurorcarbons, hydrofluorocarbons, sulfur hexafluoride and/or nitrogen trifluoride. The pair of anisotropically patterned contact vias 45*a* and 45*b* is formed employing the first anisotropic etching plasma 48 until the surfaces of the source/drain electrode regions 38*a* and 38*b* are reached, which will typically provide anisotropically etched contact vias 45*a* and 45*b* with various etch residues formed therein.

Figure 7:
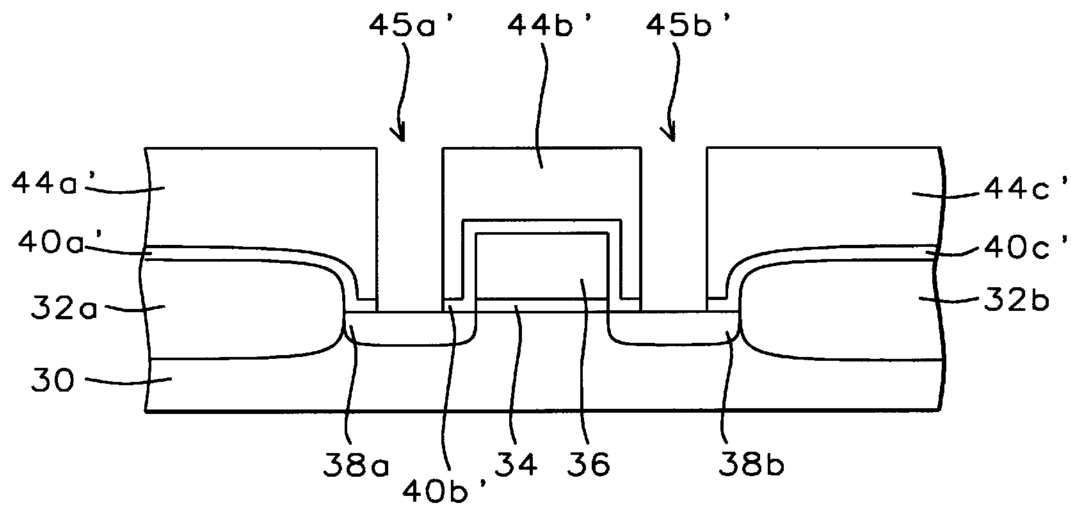

Referring now to FIG. 7, there is shown a schematic cross-sectional diagram illustrating the results of further processing of the integrated circuit microelectronics fabrication whose schematic cross-sectional diagram is illustrated in FIG. 6. Shown in FIG. 7 is a schematic cross-sectional diagram of an integrated circuit microelectronics fabrication otherwise equivalent to the integrated circuit microelectronics fabrication whose schematic cross-sectional diagram is illustrated in FIG. 6, but wherein: (1) the patterned first photoresist layers 46*a*, 46*b* and 46*c* have been stripped from the integrated circuit microelectronics fabrication; and (2) the anisotropically patterned contact vias 45*a* and 45*b* have been isotropically etched to form the isotropically etched anisotropically patterned contact vias 45*a*′ and 45*b*′. Anisotropically patterned contact vias, such as the anisotropically patterned contact vias 45*a* and 45*b*, are typically isotropically etched within aqueous hydrofluoric acid containing isotropic etchants such as dilute hydrofluoric acid solutions and buffered oxide etchant (BOE) solutions is order to either remove reactive ion etch (RIE) residues from those anisotropically patterned contact vias or to pre-clean contact regions, such as but not limited to source/drain electrode contact regions, prior to forming conductor contact stud layers within those anisotropically patterned contact vias.

For the preferred embodiment of the present invention, the patterned first photoresist layers 46*a*, 46*b* and 46*c* may be stripped from the integrated circuit microelectronics fabrication whose schematic cross-sectional diagram is illustrated in FIG. 6 to form in part the integrated circuit microelectronics fabrication whose schematic cross-sectional diagram is illustrated in FIG. 7 through photoresist stripping methods as are conventional in the art of integrated circuit microelectronics fabrication. Such photoresist stripping methods will typically, although not exclusively, include dry oxygen plasma stripping methods.

For the first preferred embodiment of the present invention, the anisotropically patterned contact vias 45*a* and 45*b* as illustrated in FIG. 6 are isotropically etched to form the isotropically etched anisotropically patterned contact vias 45*a*′ and 45*b*′ as illustrated within FIG. 7 through etching within a 50:1 buffered oxide etchant (BOE) solution at a temperature of from about 20 to about 30 degrees centigrade for a time period of from about 10 to about 20 seconds.

As is illustrated within the schematic cross-sectional diagram of FIG. 7, the isotropically etched anisotropically patterned contact vias 45*a*′ and 45*b*′ are minimally etched in comparison with the anisotropically patterned contact vias 45*a* and 45*b* as illustrated in FIG. 6 (ie: typically less than about 300 angstroms of doped silicate glass dielectric material is removed). More particularly, as is illustrated within the schematic cross-sectional diagram of FIG. 7, there is avoided voids within the isotropically etched anisotropically patterned contact vias 45*a*′ and 45*b*′ at the interfaces of the isotropically etched anisotropically patterned planarized gap filling doped silicate glass pre-metal dielectric (PMD) layers 44*a*′, 44*b*′ and 44*c*′ and the corresponding isotropically etched anisotropically patterned conformal pre-metal dielectric (PMD) layers 40*a*′, 40*b*′ and 40*c*′.

Figure 8:
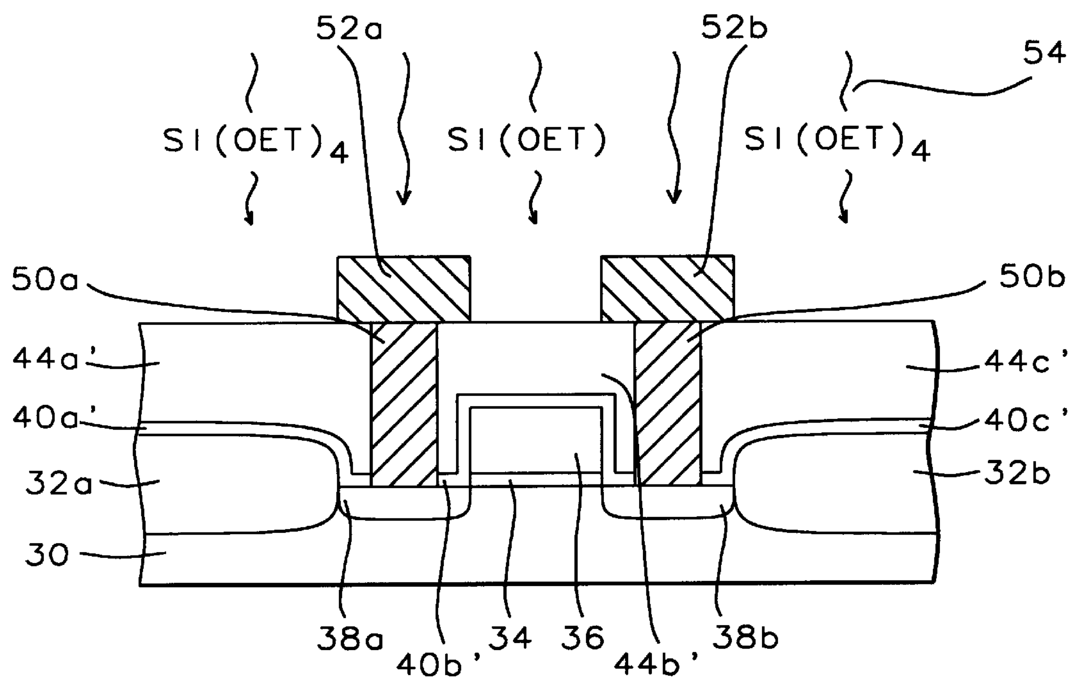

Referring now to FIG. 8, there is shown a schematic cross-sectional diagram illustrating the results of further processing of the integrated circuit microelectronics fabrication whose schematic cross-sectional diagram is illustrated in FIG. 7. Shown in FIG. 8 is a schematic cross-sectional diagram of an integrated circuit microelectronics fabrication otherwise equivalent to the integrated circuit microelectronics fabrication whose schematic cross-sectional diagram is illustrated in FIG. 7, but wherein in part: (1) there has been formed within the pair of isotropically etched anisotropically patterned contact vias 45*a*′ and 45*b*′ a corresponding pair of conductive contact studs 50*a* and 50*b*; and (2) there has been formed upon the pair of conductive contact studs 50*a* and 50*b* a corresponding pair of patterned first conductor layers 52*a* and 52*b*.

Within the preferred embodiment of the present invention, the pair of conductive contact studs 50*a* and 50*b* may be formed within the pair of isotropically etched anisotropically patterned contact vias 45*a*′ and 45*b*′ through methods and materials as are conventional in the art of integrated circuit microelectronics fabrication. Typically and preferably, the conductive contact studs 50*a* and 50*b* will be formed at least in part of tungsten conductive material deposited through a chemical vapor deposition (CVD) method, as is common in the art of integrated circuit microelectronics fabrication. Similarly, the pair of patterned first conductor layers 52*a* and 52*b* may be formed contacting the pair of conductive contact studs 50*a* and 50*b* through methods and materials as are also conventional in the art of integrated circuit microelectronics fabrication. Typically and preferably, the patterned first conductor layers 52*a* and 52*b* are formed at least in part of an aluminum containing conductor material, as is similarly common in the art of integrated circuit microelectronics fabrication. Preferably, each conductive contact stud 50*a* or 50*b* is formed to a thickness sufficient to reach the upper surfaces of the series of isotropically etched anisotropically patterned planarized gap filling doped silicate glass pre-metal dielectric (PMD) layers 44*a*′, 44*b*′ and 44*c*′, while each patterned first conductor layer 52*a* or 52*b* is preferably formed to a thickness of from about 8000 to about 10000 angstroms.

Finally, there is shown within FIG. 8 the presence of a second tetra ethyl ortho silicate (TEOS) silicon source material stabilizing flow 54. Within the preferred embodiment of the present invention, the second tetra ethyl ortho silicate (TEOS) silicon source material stabilizing flow 54 as illustrated within the schematic cross-sectional diagram of FIG. 8, is preferably provided employing methods, materials and conditions analogous to the methods, materials and conditions employed when providing the first tetra ethyl ortho silicate (TEOS) silicon source material stabilizing flow 42 as illustrated within the schematic cross-sectional diagram of FIG. 4.

Figure 9:
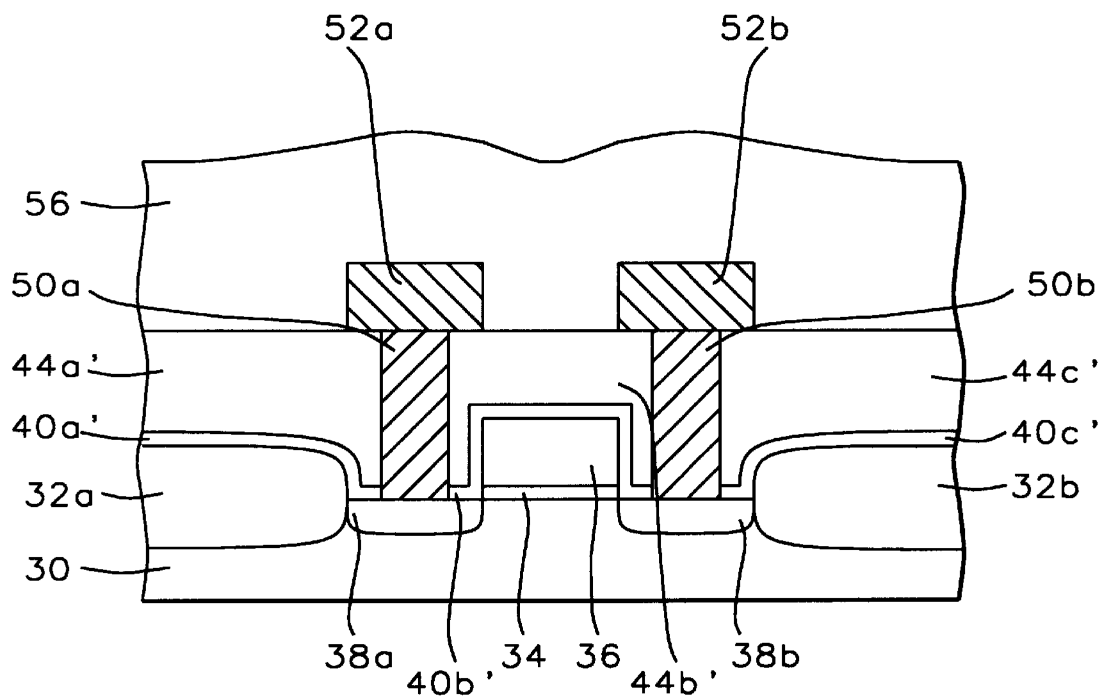

Referring now to FIG. 9, there is shown a schematic cross-sectional diagram illustrating the results of further processing of the integrated circuit microelectronics fabrication whose schematic cross-sectional diagram is illustrated in FIG. 8. Shown in FIG. 9 is a schematic cross-sectional diagram of an integrated circuit microelectronics fabrication otherwise equivalent to the integrated circuit microelectronics fabrication whose schematic cross-sectional diagram is illustrated in FIG. 8, but wherein there is formed upon the integrated circuit microelectronics fabrication a blanket gap filling doped silicate glass inter-metal dielectric (IMD) layer 56. The blanket gap filing doped silicate glass inter-metal dielectric (IMD) layer 56 as illustrated in FIG. 9 is preferably formed employing methods, materials, conditions and thicknesses analogous or equivalent to the methods, materials, conditions and thickness employed in forming the blanket gap filling doped silicate glass pre-metal dielectric (PMD) layer 44 within the integrated circuit microelectronics fabrication whose schematic cross-sectional diagram is illustrated in FIG. 5.

Figure 10:
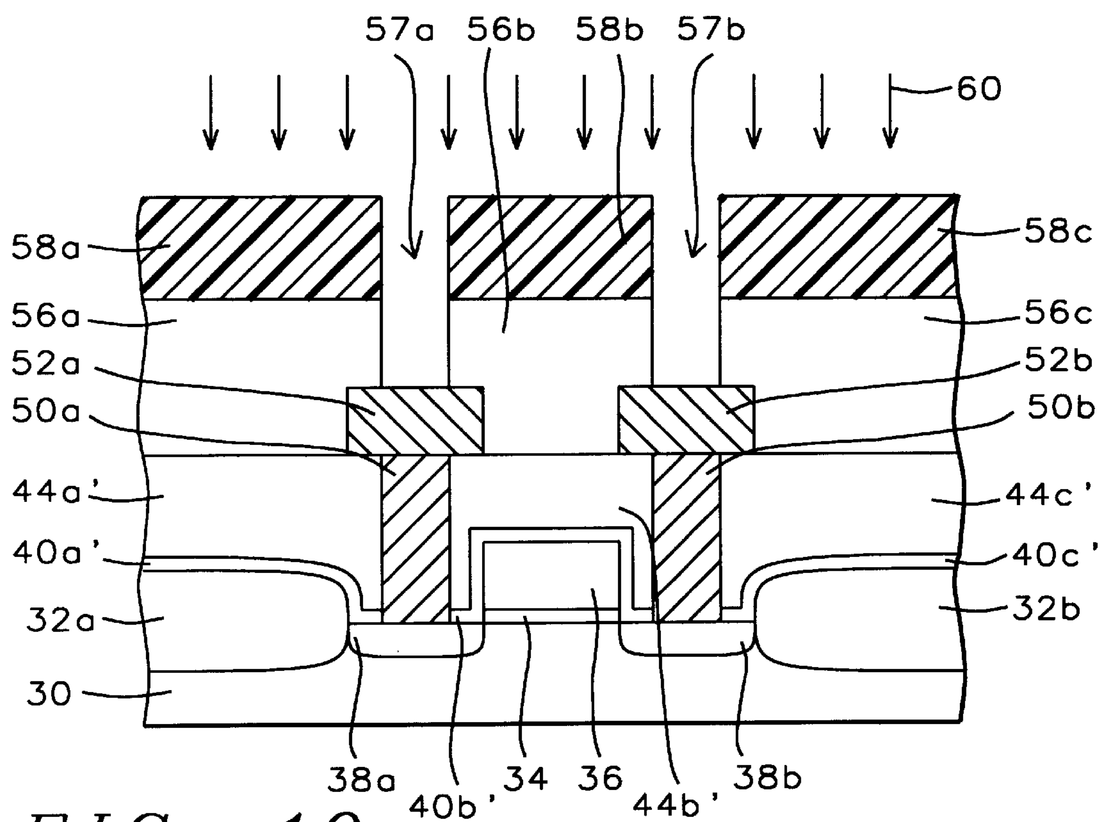

Referring now to FIG. 10, there is shown a schematic cross-sectional diagram illustrating the results of further processing of the integrated circuit microelectronics fabrication whose schematic cross-sectional diagram is illustrated in FIG. 9. Shown in FIG. 10 is a schematic cross-sectional diagram of an integrated circuit microelectronics fabrication otherwise equivalent to the integrated circuit microelectronics fabrication whose schematic cross-sectional diagram is illustrated in FIG. 9, but wherein: (1) the blanket gap filling doped silicate glass inter-metal dielectric (IMD) layer 56 has been planarized to form a blanket planarized gap filling doped silicate glass inter-metal dielectric (IMD) layer; (2) the blanket planarized gap filling doped silicate glass inter-metal dielectric (IMD) layer so formed has formed thereupon a series of patterned second photoresist layers 58*a*, 58*b* and 58*c*; and (3) the blanket planarized gap filling doped silicate glass inter-metal dielectric (IMD) layer has been anisotropically patterned to form a series of anisotropically patterned planarized gap filling doped silicate glass inter-metal dielectric (IMD) layers 56*a*, 56*b* and 56*c* which define a pair of anisotropically patterned interconnection vias 57*a* and 57*b* while employing a second anisotropic etching plasma 60 and the series of patterned second photoresist layers 58*a*, 58*b* and 58*c* as a second etch mask layer.

When forming within the preferred embodiment of the present invention the integrated circuit microelectronics fabrication whose schematic cross-sectional diagram is illustrated in FIG. 10 from the integrated circuit microelectronics fabrication whose schematic cross-sectional diagram is illustrated in FIG. 9, there are employed methods, materials, conditions and dimensions analogous or equivalent to the methods, materials, conditions and dimensions employed in forming within the preferred embodiment of the present invention the integrated circuit microelectronics fabrication whose schematic cross-sectional diagram is illustrated in FIG. 6 from the integrated circuit microelectronics fabrication whose schematic cross-sectional diagram is illustrated in FIG. 5.

Figure 11:
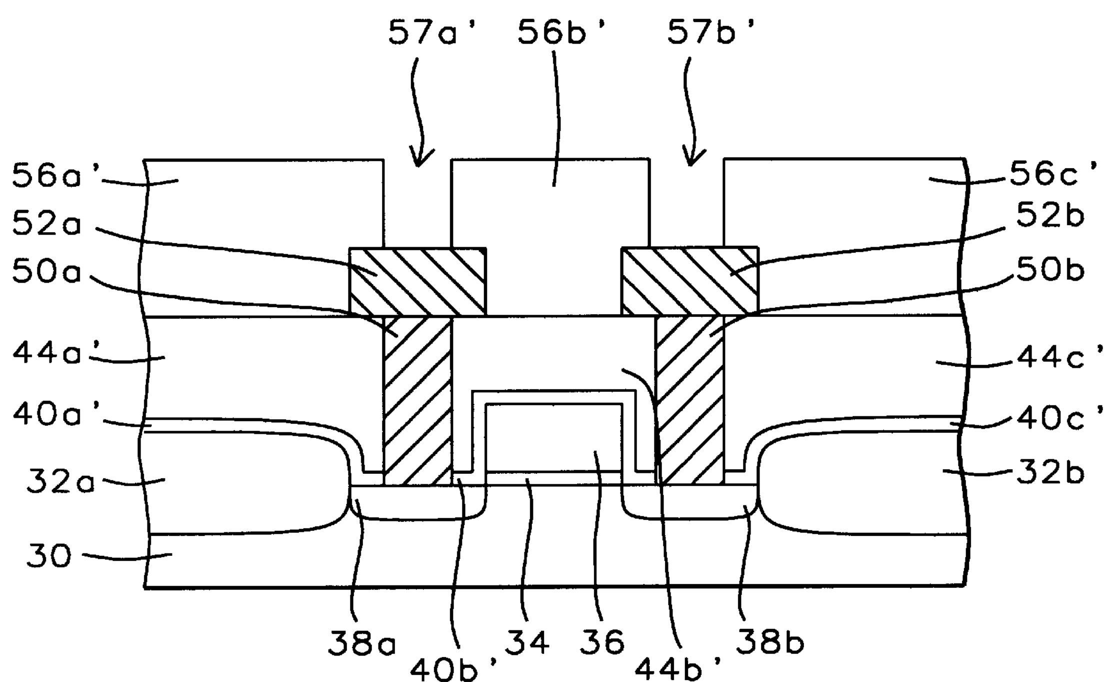

Referring now to FIG. 11, there is shown a schematic cross-sectional diagram illustrating the results of further processing of the integrated circuit microelectronics fabrication whose schematic cross-sectional diagram is illustrated in FIG. 10. Shown in FIG. 11 is a schematic cross-sectional diagram of an integrated circuit microelectronics fabrication otherwise equivalent to the integrated circuit microelectronics fabrication whose schematic cross-sectional diagram is illustrated in FIG. 10, but wherein: (1) the patterned photoresist layers 58*a*, 58*b* and 58*c* have been stripped from the integrated circuit microelectronics fabrication; and (2) the anisotropically patterned interconnection vias 57*a* and 57*b* have been isotropically etched to form a pair of isotropically etched anisotropically patterned interconnection vias 57*a'* and 57*b'*.

Within the preferred embodiment of the present invention, the integrated circuit microelectronics fabrication whose schematic cross-sectional diagram is illustrated in FIG. 11 is formed from the integrated circuit microelectronics fabrication whose schematic cross-sectional diagram is illustrated in FIG. 10 through methods, materials and conditions analogous or equivalent to the methods, materials and conditions employed in forming within the preferred embodiment of the present invention the integrated circuit microelectronics fabrication whose schematic cross-sectional diagram is illustrated in FIG. 7 from the integrated circuit microelectronics fabrication whose schematic cross-sectional diagram is illustrated in FIG. 6.

In particular, as is seen within the schematic cross-sectional diagram of FIG. 11, there is avoided through the method of the present invention voids within the sidewalls of the isotropically etched anisotropically patterned interconnection vias 57*a'* and 57*b'* at the junctures of the isotropically etched anisotropically patterned planarized gap filling doped silicate glass inter-metal dielectric (IMD) layers 56*a'*, 56*b'* and 56*c'* with the corresponding patterned first conductor layers 52*a* and 52*b*.

Thus, upon forming the integrated circuit microelectronics fabrication whose schematic cross-sectional diagram is illustrated in FIG. 11, there is formed an integrated circuit having formed therein two pair of isotropically etched anisotropically patterned vias defined by isotropically etched anisotropically patterned doped silicate glass dielectric layers, where the two pair of isotropically etched anisotropically patterned vias have void free sidewalls. The isotropically etched anisotropically patterned vias are formed with void free sidewalls due to the tetra ethyl ortho silicate (TEOS) silicon source material pre-deposition stabilizing flow employed within the method of the present invention prior to formation of a doped silicate glass layer from which is formed the isotropically etched anisotropically patterned doped silicate glass layers.

EXAMPLES

Upon each of two semiconductor substrates was formed a series of field effect transistor (FET) structures and a blanket conformal pre-metal dielectric (PMD) layer generally similar to the field effect transistor (FET) structure and blanket conformal pre-metal dielectric (PMD) layer 40 whose schematic cross-sectional diagram is illustrated in FIG. 3. Upon a first of the two semiconductor substrates there was then formed upon the blanket conformal pre-metal dielectric (PMD) layer a blanket gap filling doped silicate glass pre-metal dielectric (PMD) layer largely equivalent to the blanket gap filling doped silicate glass pre-metal dielectric (PMD) layer 44 within the preferred embodiment of the present invention. In accord with the preferred embodiment of the present invention, the blanket gap filling doped silicate glass pre-metal dielectric (PMD) layer was formed through an ozone assisted sub-atmospheric pressure thermal chemical vapor deposition (SACVD) method.

The ozone assisted sub-atmospheric pressure thermal chemical vapor deposition (SACVD) method employed: (1) a reactor chamber pressure of about 200 torr; and (2) a semiconductor substrate temperature of about 400 degrees centigrade. The ozone assisted sub-atmospheric pressure thermal chemical vapor deposition (SACVD) method also sequentially employed: (1) a first pre-deposition stabilization process step; (2) a second pre-deposition stabilization process step; (3) a first deposition step; and (4) a second deposition step.

The first pre-deposition stabilization process step employed: (1) an oxygen flow at about 3000 standard cubic centimeters per minute (sccm); and (2) a helium flow at about 6000 standard cubic centimeters per minute (sccm), for a time period of about 3 seconds. The second pre-deposition stabilization process step employed: (1) an oxygen flow at about 3000 standard cubic centimeters per minute (sccm); (2) a helium flow at about 6000 standard cubic centimeters per minute (sccm); and (3) a tetra ethyl ortho silicate (TEOS) flow at about 500 standard cubic centimeters per minute (sccm), for a time period of about 2 seconds. The first deposition step employed: (1) an ozone flow at about 4500 standard cubic centimeters per minute (sccm) within an oxygen carrier gas flow at about 3000 standard cubic centimeters per minute (sccm); (2) a helium flow at about 6000 standard cubic centimeters per minute (sccm); (3) a tetra ethyl ortho silicate (TEOS) flow at about 500 standard cubic centimeters per minute (sccm); (4) a triethyl borane flow at about 193 standard cubic centimeters per minute (sccm); and (5) a triethyl phosphite flow at about 50 standard cubic centimeters per minute (sccm), for a time period of about 2 seconds. The second deposition step employed materials and flows otherwise equivalent to those employed within the first deposition step, with the exception that the triethyl phosphite flow was reduced to about 34 standard cubic centimeters per minute (sccm). The second deposition step was employed for a time period of about 180 seconds to provide upon the blanket conformal pre-metal dielectric (PMD) layer upon the first semiconductor substrate a blanket gap filling doped silicate glass pre-metal dielectric (PMD) layer of thickness about 9000 angstroms.

Upon the blanket conformal pre-metal dielectric (PMD) layer upon the second of the two semiconductor substrates was formed a blanket gap filling doped silicate glass pre-metal dielectric (PMD) layer otherwise equivalent to the blanket gap filling doped silicate glass pre-metal (PMD) dielectric layer upon the blanket conformal pre-metal dielectric (PMD) layer upon the first semiconductor substrate, but without employing the second pre-deposition stabilization process step.

Each of the two blanket gap filling doped silicate glass pre-metal dielectric (PMD) layers was then planarized and then had formed thereupon a series of patterned photoresist layers employed as etch mask layers for anisotropically patterning the blanket gap filling doped silicate glass pre-metal dielectric (PMD) layers and blanket conformal pre-metal dielectric (PMD) layers to define anisotropically patterned contact vias reaching the source/drain electrode regions of the series of field effect transistors (FETs) formed upon each of the semiconductor substrates. The blanket planarized gap filling doped silicate glass pre-metal dielectric (PMD) layers and the corresponding blanket conformal pre-metal dielectric (PMD) layers where then etched to form the anisotropically patterned contact vias employing a plasma etch method employing (1) a reactor chamber pressure of about 8 torr; (2) a radio frequency power of about 2000 watts at a radio frequency of 13.56 MHZ; (3) a semiconductor substrate temperature of about 400 degrees centigrade; and (4) a carbon tetrafluoride etchant gas at a flow rate of about 3000 standard cubic centimeters per minute, for a time period of about 100 seconds.

The patterned photoresist layers upon each of the two semiconductor substrates were then stripped employing a dry oxygen plasma stripping method as is conventional in the art of integrated circuit microelectronics fabrication. Each of the two semiconductor substrates was then isotropically etched within a 50:1 buffered oxide etchant (BOE) solution for a time period of about 10 seconds and a temperature of about 25 degrees centigrade, as would commonly be employed within integrated circuit microelectronics fabrication to remove plasma etch residues from the exposed source/drain electrode regions within the anisotropically patterned contact vias or to preclean the source/drain electrode region contacts prior to conductor contact layer deposition within anisotropically patterned contact vias.

Each of the two semiconductor substrates was then cross-sectionally cleaved and inspected through scanning electron microscope (SEM) analysis to ascertain the extent of void formation within the sidewalls of the isotropically etched anisotropically patterned source/drain electrode region contact vias. The isotropically etched and anisotropically patterned source/drain electrode region contact vias formed upon the first semiconductor substrate exhibited no voids, while the isotropically etched anisotropically patterned source/drain electrode region contact vias formed upon the second semiconductor substrate exhibited sidewall voids at the junctures of the isotropically etched anisotropically patterned conformal pre-metal dielectric (PMD) layers and the isotropically etched anisotropically patterned planarized gap filling doped silicate glass pre-metal dielectric (PMD) layers.

Thus, consistent with the preferred embodiment of the present invention, doped silicate glass dielectric layers formed employing the method of the present invention may have formed therethrough isotropically etched anisotropically patterned vias without sidewall voids.

As is understood by a person skilled in the art, the preferred embodiment and examples of the present invention are illustrative of the present invention rather than limiting of the present invention. Revisions and modifications may be made to methods, materials, structures and dimensions through which is provided the preferred embodiment and examples of the present invention while still providing embodiments and examples which are within the spirit and scope of the present invention, as defined by the appended claims.

What is claimed is:

1. A method for forming through a doped silicate glass dielectric layer within a microelectronics fabrication a via comprising:

positioning within a reactor chamber a substrate employed within a microelectronics fabrication;

stabilizing the substrate within the reactor chamber by introducing into the reactor chamber a first flow of a silicon source material absent a flow of a dopant source material;

depositing then upon the substrate within the reactor chamber a doped silicate glass dielectric layer through a chemical vapor deposition (CVD) method, the doped silicate glass dielectric layer being formed employing a second flow of the silicon source material, a flow of an oxidant source material and the flow of the dopant source material;

anisotropically patterning the doped silicate glass dielectric layer to form an anisotropically patterned doped silicate glass dielectric layer defining an anisotropically patterned via accessing the substrate; and isotropically etching the anisotropically patterned doped silicate glass dielectric layer to form an isotropically etched anisotropically patterned doped silicate glass dielectric layer defining an isotropically etched anisotropically patterned via accessing the substrate, wherein by stabilizing the substrate within the reactor chamber by introducing into the reactor chamber the first flow of the silicon source material absent the flow of the dopant source material the isotropically etched anisotropically patterned via is formed without a void in the sidewall of the isotropically etched anisotropically patterned via at the juncture of the isotropically etched anisotropically patterned doped silicate glass dielectric layer and the substrate.

2. The method of claim 1 wherein by introducing into the reactor chamber the first flow of the silicon source material absent the flow of the dopant source material there is also precluded initial formation of a dopant rich doped silicate glass dielectric region within the doped silicate glass dielectric layer.

3. The method of claim 1 wherein the microelectronics fabrication is chosen from the group of microelectronics fabrications consisting of integrated circuit microelectronics fabrications, solar cell microelectronics fabrications, ceramic substrate microelectronics fabrications and flat panel display microelectronics fabrications.

4. The method of claim 1 wherein the chemical vapor deposition (CVD) method is chosen from the group of chemical vapor deposition methods consisting of low pressure thermal chemical vapor deposition (LPCVD) methods, plasma enhanced chemical vapor deposition (PECVD) methods, sub-atmospheric pressure thermal chemical vapor deposition (SACVD) methods and atmospheric pressure thermal chemical vapor deposition (APCVD) methods.

5. The method of claim 1 wherein the silicon source material is chosen from the group of silicon source materials consisting of silane and tetra ethyl ortho silicate (TEOS).

6. The method of claim 1 wherein the oxidant source material is chosen from the group of oxidant source materials consisting of oxygen, ozone, nitrous oxide and nitric oxide.

7. The method of claim 1 wherein the dopant source material is chosen from the group of dopant source materials consisting of boron containing dopant source materials, phosphorus containing dopant source materials and mixtures of boron containing dopant source materials and phosphorus containing dopant source materials.

8. The method of claim 1 wherein the doped silicate glass dielectric layer is formed as a single layer doped silicate glass dielectric layer.

9. The method of claim 1 wherein the anisotropically patterned doped silicate glass dielectric layer is isotropically etched to form the isotropically etched anisotropically patterned doped silicate glass dielectric layer while employing a buffered oxide etchant (BOE) isotropic etchant.

10. The method of claim 1 wherein the doped silicate glass dielectric layer is formed from a borosilicate glass (BSG) dielectric material.

11. The method of claim 1 wherein the doped silicate glass dielectric layer is formed from a phosphosilicate glass (PSG) dielectric material.

12. The method of claim 1 wherein the doped silicate glass dielectric layer is formed of a borophosphosilicate glass (BPSG) dielectric material.

* * * * *